US012777599B2

(12) United States Patent
Kwon et al.

(10) Patent No.: US 12,777,599 B2
(45) Date of Patent: Oct. 27, 2026

(54) DISPLAY DEVICE

(71) Applicant: LG ELECTRONICS INC., Seoul (KR)

(72) Inventors: Hyeongjun Kwon, Seoul (KR); Seokho Kwon, Seoul (KR); Sanghoon Kim, Seoul (KR); Yoosung Doh, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 95 days.

(21) Appl. No.: 18/642,393

(22) Filed: Apr. 22, 2024

(65) Prior Publication Data

US 2024/0422930 A1 Dec. 19, 2024

(30) Foreign Application Priority Data

Jun. 14, 2023 (KR) ........................ 10-2023-0076017

(51) Int. Cl.

*H05K 5/02* (2006.01)
*F16C 11/12* (2006.01)
*H10K 59/35* (2023.01)
*H10K 102/00* (2023.01)

(52) U.S. Cl.

CPC ............ *H05K 5/0234* (2013.01); *F16C 11/12* (2013.01); *H05K 5/0226* (2013.01); *H10K 59/35* (2023.02); *H10K 2102/311* (2023.02)

(58) Field of Classification Search

None

See application file for complete search history.

(56) References Cited

U.S. PATENT DOCUMENTS 8,177,175 B2 * 5/2012 Chang .................... F16M 11/10 248/168
10,051,752 B1 * 8/2018 Meyers ................ H05K 5/0234
2011/0164358 A1 * 7/2011 Duan ................... H05K 5/0234 361/679.01

FOREIGN PATENT DOCUMENTS

KR 10-2010-0008138 1/2010
KR 10-2019-0064939 6/2019

OTHER PUBLICATIONS

Korean Intellectual Property Office Application No. 10-2023-0076017, Office Action dated Oct. 10, 2024, 5 pages.

* cited by examiner

*Primary Examiner* — Xanthia C Relford

(74) *Attorney, Agent, or Firm* — LEE, HONG, DEGERMAN, KANG & WAIMEY

(57) ABSTRACT

Disclosed is a display device including a main body having a display located on a front surface thereof, a back cover covering a rear surface of the main body, a stand panel coupled to the back cover via a hinge module, an elastic hinge module located on a front surface of the back cover and coupled to the stand panel via a hinge hole defined in the back cover to adjust an angle of the stand panel with respect to the back cover, and a button including a latch coupled to the stand panel and fastened to the back cover. The display device is able to be easily mounted anywhere via the stand panel on a rear surface thereof without a need to additionally combine a separate stand.

15 Claims, 10 Drawing Sheets

(a) (b)

(a) (b)

DISPLAY DEVICE

CROSS-REFERENCE TO RELATED APPLICATION

Pursuant to 35 U.S.C. § 119 (a), this application claims the benefit of earlier filing date and right of priority to Korean Patent Application No. 10-2023-0076017, filed on Jun. 14, 2023, the contents of which are hereby incorporated by reference herein in its entirety.

BACKGROUND

Field

The present disclosure relates to a display device equipped with a foldable stand that may easily mount the display device.

Discussion of the Related Art

With growth of information society, demand for various display devices has increased. In order to satisfy such demand, in recent years, a liquid crystal display (LCD), a field emission display (FED), a plasma display panel (PDP), and an electroluminescent device have been developed as display devices.

A liquid crystal panel of the liquid crystal display includes a liquid crystal layer and a TFT substrate and a color filter substrate opposite each other in the state in which the liquid crystal layer is interposed therebetween, wherein a picture is displayed using light provided from a backlight unit.

An active matrix type organic light-emitting display has come onto the market as an example of the electroluminescent device. Since the organic light-emitting display is self-emissive, the organic light-emitting display has no backlight, compared to the liquid crystal display, and has merits in terms of response time and viewing angle, and therefore the organic light-emitting display has attracted attention as a next-generation display.

Recently, because a material such as an OLED emits light by itself without a backlight structure at a rear surface thereof, a curved display module may be implemented, so that a curved display device may be implemented.

As a thickness of the display device becomes smaller, a trend of using a large display device in a mobile type rather than a fixed type is increasing. In the case of the mobile type, the device must be able to be mounted regardless of a location, so that a stable stand structure is necessary.

SUMMARY

The present disclosure is to provide a display device equipped with a foldable stand that may easily mount the display device.

In addition, the present disclosure is to provide a display device that secures rigidity of a joint of a stand to support a load of a large device and to be stably mounted.

Provided is a display device including a main body having a display located on a front surface thereof, a back cover covering a rear surface of the main body, a stand panel coupled to the back cover via a hinge module, an elastic hinge module located on a front surface of the back cover and coupled to the stand panel via a hinge hole defined in the back cover to adjust an angle of the stand panel with respect to the back cover, and a button including a latch coupled to the stand panel and fastened to the back cover.

The button may include a button main body fixed to the stand panel and having the latch protruding forwards, a pressable portion that is exposed on a rear surface of the stand panel and separates the latch of the button main body from the back cover when pressed, and a button spring located between the button main body and the pressable portion.

The display device may further include an open elastic portion that is coupled to the back cover and provides a force of pushing the button rearwards.

The open elastic portion may be located on the front surface of the back cover, and the back cover may include a button seating portion inserted forwards at a location corresponding to the button, a latch receiving hole defined in the button seating portion, and a button hole defined in the button seating portion so as to be in contact with the open elastic portion and opening at least a portion of the button.

The elastic hinge module may include a first hinge bracket coupled to the back cover at a location above the hinge hole, a second hinge bracket coupled to the stand panel via the hinge hole, a hinge shaft connecting the first hinge bracket and the second hinge bracket to each other, and a hinge spring that provides elasticity to maintain an open angle between the first hinge bracket and the second hinge bracket.

The display device may further include a shaft hole defined to be spaced apart from the hinge hole in a horizontal direction, a first shaft joint located at an upper end of the stand panel and extending forwardly of the back cover via the shaft hole, a second shaft joint located laterally adjacent to the first shaft joint, and an auxiliary shaft extending through the first shaft joint and the second shaft joint.

The display device may further include a stand opening located on the shaft hole and the hinge hole and defined at a location corresponding to the upper end of the stand panel, and the stand opening may be connected to the shaft hole and the hinge hole.

The display device may further include a reinforcing bracket coupled to the front surface of the back cover and covering the stand opening.

The reinforcing bracket may include a shaft reinforcing portion surrounding the first shaft joint.

The button may be located at a center in a horizontal direction of the stand panel, and the elastic hinge module may include a plurality of elastic hinge modules spaced apart from each other in a lateral direction.

The back cover may include a stand seating portion retracted forwards at a location corresponding to the stand panel with a depth corresponding to a thickness of the stand panel.

The display device according to at least one embodiment of the present disclosure may be easily mounted anywhere via the foldable stand panel on the rear surface thereof without the need to additionally combine the separate stand.

In addition, the display device that secures the rigidity of the joint of the stand to support the load of the large device and to be stably mounted may be provided.

In addition, the opening operation of the stand panel is made semi-automatically, so that the stand panel is opened and closed stably.

Effects obtainable from the present disclosure may be non-limited by the above-mentioned effects. And, other unmentioned effects can be clearly understood from the following description by those having ordinary skill in the technical field to which the present disclosure pertains.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DESCRIPTION OF SPECIFIC EMBODIMENTS

Figure 1:
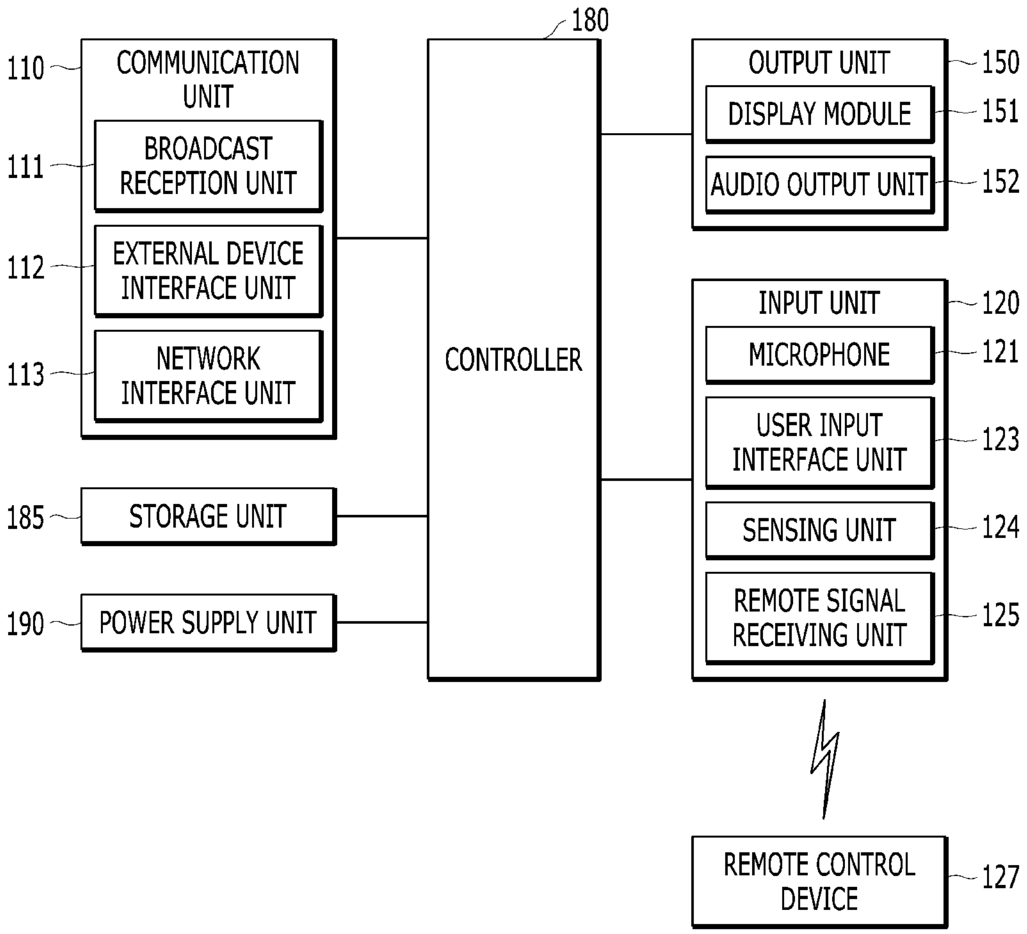
FIG. 1 is a block diagram illustrating components of a display device according to the present disclosure.

Description will now be given in detail according to exemplary embodiments disclosed herein, with reference to the accompanying drawings. For the sake of brief description with reference to the drawings, the same or equivalent components may be provided with the same reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In the present disclosure, that which is well-known to one of ordinary skill in the relevant art has generally been omitted for the sake of brevity. The accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that although the terms first, second, etc. may be used herein to describe various elements, these elements should not be limited by these terms. These terms are generally only used to distinguish one element from another.

It will be understood that when an element is referred to as being "connected with" another element, the element can be directly connected with the other element or intervening elements may also be present. In contrast, when an element is referred to as being "directly connected with" another element, there are no intervening elements present.

A singular representation may include a plural representation unless it represents a definitely different meaning from the context.

Terms such as "include" or "has" are used herein and should be understood that they are intended to indicate an existence of several components, functions or steps, disclosed in the specification, and it is also understood that greater or fewer components, functions, or steps may likewise be utilized.

Meanwhile, an image display device 100 described in this specification is, for example, an intelligent image display device 100 having a computer supporting function in addition to a broadcast reception function, wherein an Internet function may be added while the broadcast reception function is devotedly performed, whereby an interface that is more conveniently used, such as a handwriting type input device, a touchscreen, or a space remote control, may be provided. In addition, the image display device may be connected to the Internet or a computer through support of a wired or wireless Internet function, whereby various functions, such as e-mail, web browsing, banking, or gaming, may be executed. For such various functions, a standardized general-purpose OS may be used.

In the image display device described in the present disclosure, therefore, various applications may be freely added or deleted, for example, on a general-purpose OS kernel, whereby various user friendly functions may be executed. More specifically, the image display device may be a network TV, an Hbb TV, or a smart TV, and is applicable to a smartphone depending on circumstances.

FIG. 1 is a block diagram illustrating components of a display device 100.

The display device 100 may include a communication unit 110, an input unit 120, a sensing unit 124, an output unit 150, a controller 180, a storage unit 185, and a power supply unit 190. The configuration shown in FIG. 1 may include only some of the components, and one configuration may perform two functions.

The communication unit 110 may include a broadcast reception unit 111 including a tuner unit and a demodulator. The tuner unit of the broadcast reception unit 111 may select a broadcast signal corresponding to a channel selected by a user or any one of all pre-stored channels, among broadcast signals received through an antenna (not shown) or a cable (not shown). The tuner unit 111 may convert the selected broadcast signal into an intermediate frequency signal or a baseband video or audio signal.

Meanwhile, the tuner unit may sequentially select broadcast signals of all broadcast channels stored through a channel memory function, among received broadcast signals, and may convert each of the selected broadcast signals into an intermediate frequency signal or a baseband video or audio signal The demodulation unit of the broadcast reception unit 111 may receive the digital IF (DIF) signal converted by the tuner unit, and may perform demodulation. After performing demodulation and channel decryption, the demodulation unit may output a stream signal (TS). At this time, the stream signal may be a multiplexed image, audio, or data signal.

The stream signal output from the demodulation unit may be input to the controller 180. After performing demultiplexing and image/audio signal processing, the controller 180 may output an image through the display module 151, and may output audio through the audio output unit 152.

An external device interface unit 112 may connect an external device to the display device 100 to receive an image signal, an audio signal, and a control signal from the external device. The interface unit 112 may be connected by wire/wireless to external devices such as a Digital Versatile Disk (DVD), a Blu-ray, a game device, a camera, a camcorder, a computer (laptop), and the like.

The external device interface unit 112 transmits video, audio, or data signals inputted externally to the controller 180 of the display device 100 through the connected external device. In addition, the video, audio, or data signals processed by the controller 180 may be outputted to the connected external device.

The external device interface unit 112 may include a wired type and a wireless type. The wired type includes a physical terminal provided to the display device 100, and the wireless type may be connected to an external device through an antenna that receives a wireless signal.

The wired type may include a USB terminal, a Composite Video Banking Sync (CVBS) terminal, a component terminal, an S-video terminal (analog), a Digital Visual Interface (DVI) terminal, a High Definition Multimedia Interface (HDMI) terminal, an RGB terminal, a D-SUB terminal, and so on.

The wireless type may perform short-range wireless communication with other electronic devices located nearby. The display device 100 may be connected to other electronic devices via networks according to communication standards such as Bluetooth, Radio Frequency Identification (RFID), Infrared Data Association (IrDA), Ultra Wideband (UWB), ZigBee, Digital Living Network Alliance (DLNA), etc.

The network interface unit 113 may access a prescribed web page through a connected network or another network linked to the connected network. That is, the network interface unit 113 may transmit and receive data with a corresponding server by accessing the prescribed web page through the network. In addition, the network interface unit 113 may receive contents or data provided by a content provider or a network operator.

That is, contents such as movies, advertisements, games, VODs, and broadcast signals provided from content providers or network providers and information related to such contents may be received through the network. In addition, update information and update files of firmware provided by the network operator may be received. In addition, data may be transmitted to the Internet or content provider or network operator.

In addition, the network interface unit 113 may select a desired application from applications opened to the public and receive the selected application through the network.

According to an embodiment, when a game application is executed in the display device, the network interface unit 113 may transmit or receive prescribed data to or from a user terminal connected to the display device via the network. Also, prescribed data may be transmitted or received with a server that stores game scores The input unit 120 may include a microphone 121 that collects sound, a user input unit 123 that detects a user's command, a sensor unit that senses a state and surrounding state of the display device, and a remote signal reception unit 125 that receives a signal of a remote controller 127.

The microphone 121 may recognize a user's voice or surrounding sound, and in particular, receive a user's voice and process it as electrical audio data. Various noise cancellation algorithms for removing noise generated in the process of receiving an external audio signal may be implemented in the microphone 121.

The microphone 121 may simply collect user's voice, convert the collected voice into audio data, and store it in the storage unit 185 or transmit it to the external device via the communication unit 110, and may also perform a function as the user input unit 123 in a manner of analyzing the audio data and recognizing it as a user command.

In addition to the main body of the display device 100, the microphone 121 may be mounted on the remote controller 127, which will be described later, and the corresponding audio data may be forwarded to the controller 180 through the remote signal reception unit 125.

The user input unit 123 is a device to which a user inputs a control command for controlling the display device. The user input unit 123 may include a keypad, a button, a touch pad, a touch screen, etc.

When the user input unit 123 includes a hard key button, a user may input a command related to the display device 100 through a push operation of the hard key button. When the user input unit 123 is provided with a touchscreen, the user may input a command related to display device 100 to remote controller 127 by touching the soft key of the touchscreen.

In addition, the user input unit 123 may include various types of input means that the user can operate, such as a scroll key, a jog key, etc., and the present embodiment does not limit the scope of the right of the present disclosure.

Recently, as the size of a bezel of the display device 100 decreases, the display device 100 tends to minimize the user input unit 123 of the physical button type exposed externally. Instead, a minimum physical button is located on a rear side or a lateral side, and a user input may be received from a touchpad or the remote controller 127 through a remote signal reception unit 125 that will be described later.

The remote signal reception unit 125 may input a command related to the display device 100 through the remote controller 127 having the user input unit 123. The remote signal reception unit 125 is a sort of the user input unit 123 and may belong to a wireless communication unit because it receives signals from the remote controller 127 according to various communication methods such as Radio Frequency (RF) communication method, Infrared (IR) communication method, etc.

The sensing unit 124 refers to a device that detects a change in the display device 100 or an external change. For example, the sensing unit 124 may include at least one of a proximity sensor, an illumination sensor, a touch sensor, an Infrared (IR) sensor, an ultrasonic sensor, an optical sensor (e.g., a camera), a voice sensor (e.g., a microphone), a battery gauge, an environment sensor (e.g., a hygrometer, a thermometer, etc.), and the like.

Recently, a display device 100 that can move or change a direction of a display has emerged, and a gyro sensor, an acceleration sensor and the like may be provided to detect a posture of the display device.

Based on the information collected by the sensing unit 124, the controller 180 may check the state of the display device 100 and notify a user of a problem when the problem occurs or adjust it by itself, thereby controlling the display device 100 to maintain a best state.

In addition, the content, image quality, and size of an image provided to the display module 151 may be controlled differently depending on a viewer, a surrounding illumination and the like sensed by the sensing unit 124, thereby providing an optimal viewing environment. As smart TVs advance, functions mounted on the display device increase, and the sensing unit 124 is also increasing correspondingly.

The output unit 150 is a device that provides visual and auditory information to a user through the display device, and may include the display module 151 and the audio output unit 152.

The display module 151 may convert an image signal, a data signal, an OSD signal, and a control signal processed by the controller 180 or an image signal, a data signal, and a control signal received from the interface unit to generate a driving signal. The display module 151 may include a display panel having a plurality of pixels.

Each of the plurality of pixels in the display panel may include RGB subpixels. Alternatively, each of the plurality of pixels in the display panel may include RGBW subpixels. The display module 151 may convert an image signal, a data signal, an OSD signal, and a control signal processed by the controller 180 to generate a driving signal for the plurality of pixels.

A plasma display panel (PDP), a liquid crystal display (LCD), an organic light-emitting diode (OLED), or a flexible display may be used as the display module 151, and a 3D display may also be used. The 3D display 130 may be classified as a non-glasses type display or a glasses type display.

The display device 100 includes a display module 151, which occupies a major portion of the front surface thereof, and a case configured to cover the rear surface and the side surface of the display module 151, the case being configured to package the display module 151.

In recent years, the display device 100 has used a flexible display module 150, such as light-emitting diodes (LED) or organic light-emitting diodes (OLED), in order to implement a curved screen.

Light is supplied to an LCD, which was mainly used conventionally, through a backlight unit, since the LCD is not self-emissive. The backlight unit is a device that supplies light emitted from a light source to a liquid crystal uniformly located in front thereof. As the backlight unit has been gradually thinned, a thin LCD has been implemented. However, it is difficult to implement the backlight unit using a flexible material. If the backlight unit is curved, it is difficult to supply uniform light to the liquid crystal, whereby the brightness of a screen is changed.

In contrast, the LED or the OLED may be implemented so as to be curved, since an element constituting each pixel is self-emissive, and therefore no backlight unit is used. In addition, since each element is self-emissive, the brightness of the element is not affected even though the positional relationship between adjacent elements is changed, and therefore it is possible to implement a curved display module 150 using the LED or the OLED.

An organic light-emitting diode (OLED) panel appeared in earnest in mid 2010 and has rapidly replaced the LCD in the small- or medium-sized display market. The OLED is a display manufactured using a self-emissive phenomenon of an organic compound in which the organic compound emits light when current flows in the organic compound. The response time of the OLED is shorter than the response time of the LCD, and therefore afterimages hardly appear when video is implemented.

The OLED is an emissive display product that uses three fluorescent organic compounds having a self-emissive function, such as red, green, and blue fluorescent organic compounds and that uses a phenomenon in which electrons injected at a negative electrode and a positive electrode and particles having positive charges are combined in the organic compounds to emit light, and therefore a backlight unit, which deteriorates color, is not needed.

A light-emitting diode (LED) panel is based on technology of using one LED element as one pixel. Since it is possible to reduce the size of the LED element, compared to a conventional device, it is possible to implement a curved display module 150. The conventional device, which is called an LED TV, uses the LED as a light source of a backlight unit that supplies light to the LCD, and therefore the LED does not constitute a screen.

The display module includes a display panel and a coupling magnet, a first power supply unit, and a first signal module located at a rear surface of the display panel. The display panel may include a plurality of pixels R, G, and B. The plurality of pixels R, G, and B may be formed at intersections between a plurality of data lines and a plurality of gate lines. The plurality of pixels R, G, and B may be disposed or arranged in a matrix form.

For example, the plurality of pixels R, G, and B may include a red subpixel 'R', a green subpixel 'G', and a blue subpixel 'B'. The plurality of pixels R, G, and B may include a white subpixel 'W'.

The side of the display module 150 on which a picture is displayed may be referred to as a front side or a front surface. When the display module 150 displays the picture, the side of the display module 150 from which the picture cannot be viewed may be referred to as a rear side or a rear surface. Meanwhile, the display module 150 may be constituted by a touchscreen, whereby an input device may also be used in addition to an output device.

The audio output unit 152 receives an audio signal processed by the controller 180 and outputs the same as audio.

The controller 180 may include at least one processor, and may control the overall operation of the display device 100 using the processor included therein. Here, the processor may be a general processor, such as a central processing unit (CPU). Of course, the processor may be a dedicated device, such as an ASIC, or another hardware-based processor.

The controller 180 may demultiplex a stream input through the tuner unit, the demodulation unit the external device interface unit 112, or the network interface unit 113, or may process demultiplexed signals to generate and output a signal for image or audio output.

An image signal processed by the controller 180 may be input to the display module 151, which may display an image corresponding to the image signal. In addition, the image signal processed by the controller 180 may be input to an external output device through the external device interface unit 112.

An audio signal processed by the controller 180 may be output through the audio output unit 152. In addition, the audio signal processed by the controller 180 may be input to an external output device through the external device interface unit 112.

Further, the controller 180 may control the overall operation of the display device 100. For example, the controller 180 may control the tuner unit such that a broadcast corresponding to a channel selected by a user or a pre-stored channel is tuned.

In addition, the controller 180 may control the display device 100 according to a user command input through the user input interface unit or an internal program. Meanwhile, the controller 180 may control the display module 151 to display an image. At this time, the image displayed on the display module 151 may be a still image or video, or may be a 2D image or a 3D image.

Meanwhile, the controller 180 may perform control such that a predetermined 2D object is displayed in an image displayed on the display module 151. For example, the object may be at least one of a connected web screen (newspaper or magazine), an electronic program guide (EPG), various menus, a widget, an icon, a still image, video, and text.

Meanwhile, the controller 180 may modulate and/or demodulate a signal using an amplitude shift keying (ASK) method. Here, the amplitude shift keying (ASK) method may be a method of changing the amplitude of a carrier depending on a data value to modulate a signal or restoring an analog signal to a digital data value depending on the amplitude of a carrier.

For example, the controller 180 may modulate an image signal using the amplitude shift keying (ASK) method, and may transmit the modulated image signal through a wireless communication module.

For example, the controller 180 may demodulate and process an image signal received through the wireless communication module using the amplitude shift keying (ASK) method.

As a result, the display device 100 may easily transmit and receive a signal to and from another image display device disposed adjacent thereto without using a unique identifier, such as a media access control (MAC) address, or a complicated communication protocol, such as TCP/IP.

Meanwhile, the display device 100 may further include a photographing unit (not shown). The photographing unit may photograph a user. The photographing unit may be implemented by one camera; however, the present disclosure is not limited thereto. The photographing unit may be implemented by a plurality of cameras. Meanwhile, the photographing unit may be embedded in the display device 100 above the display module 151, or may be separately disposed. Image information photographed by the photographing unit may be input to the controller 180.

The controller 180 may recognize the location of a user based on an image captured by the photographing unit. For example, the controller 180 may recognize the distance between the user and the display device 100 (z-axis coordinate). Further, the controller 180 may recognize an x-axis coordinate and a y-axis coordinate in the display module 151 corresponding to the location of the user.

The controller 180 may sense user gesture based on the image captured by the photographing unit, a signal sensed by the sensor unit, or a combination thereof.

The storage unit 185 may store programs for signal processing and control in the controller 180, and may store a processed image, audio, or data signal. For example, the storage unit 185 may store application programs designed to execute various tasks that can be processed by the controller 180, and may selectively provide some of the stored application programs in response to request of the controller 180.

Programs stored in the storage unit 185 are not particularly restricted as long as the programs can be executed by the controller 180. The storage unit 185 may temporarily store an image, audio, or data signal received from an external device through the external device interface unit 171. The storage unit 185 may store information about a predetermined broadcast channel through a channel memory function, such as a channel map.

FIG. 1 shows an embodiment in which the storage unit 185 and the controller 180 are separately provided; however, the present disclosure is not limited thereto. The storage unit 185 may be included in the controller 180.

The storage unit 185 may include at least one of a volatile memory (e.g. DRAM, SRAM, or SDRAM), a nonvolatile memory (e.g. flash memory), a hard disk drive (HDD), and a solid-state drive (SSD).

The power supply unit 190 may supply power to the components of the display device 100. In particular, the power supply unit may supply power to the controller 180, which may be implemented in the form of a system on chip (SOC), the display module 150 for image display, and the audio output unit 160 for audio output.

Specifically, the power supply unit 190 may include an AC/DC converter (not shown) configured to convert AC power into DC power and a DC/DC converter (not shown) configured to convert the level of the DC power.

Meanwhile, the power supply unit 190 serves to distribute power supplied from the outside to the respective components of the display device. The power supply unit 190 may be directly connected to an external power supply in order to supply AC power, or may include a battery so as to be used by charging.

In the former case, a cable is used, and the power supply unit is difficult to move or the movement range of the power supply unit is limited. In the latter case, the power supply unit is free to move, but the weight of the power supply unit is increased in proportion to the weight of the battery, the volume of the power supply unit is increased, and, for charging, the power supply unit must be directly connected to a power cable or must be coupled to a charging holder (not shown) that supplies power for a predetermined time.

The charging holder may be connected to the display device through a terminal exposed to the outside, or the battery mounted in the power supply unit may be charged in a wireless manner when the power supply unit approaches the charging holder.

Meanwhile, the block diagram of the display device 100 shown in FIG. 1 is for an embodiment of the present disclosure, and elements of the block diagram may be integrated, added, or omitted depending on specifications of an actually implemented display device 100.

That is, two or more elements may be integrated into one element, or one element may be divided into two or more elements, as needed. In addition, the function performed by each block is for describing the embodiment of the present disclosure, and the specific operations and components thereof do not limit the scope of rights of the present disclosure.

Figure 2:
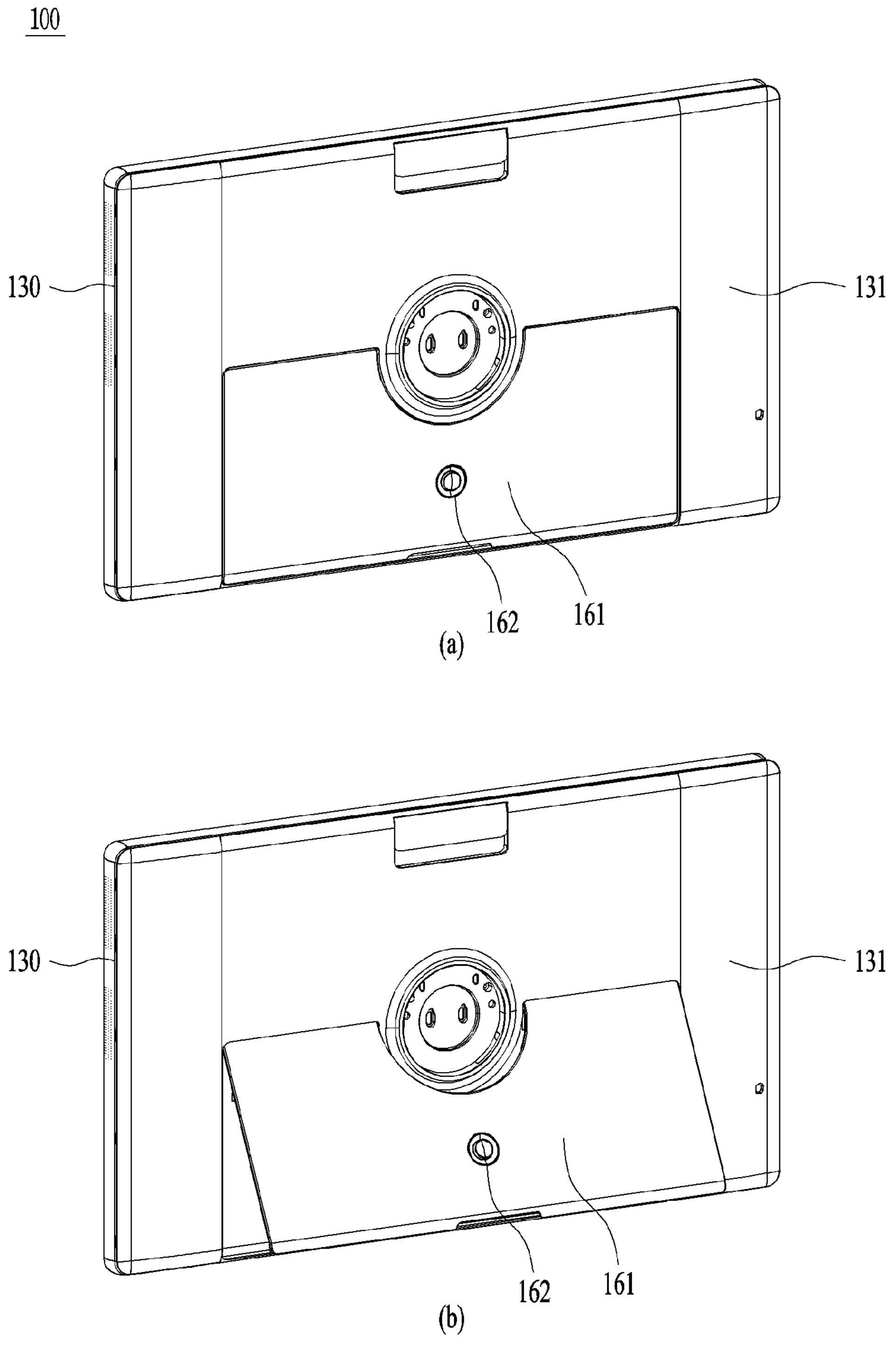
FIG. 2 is a rear perspective view showing an example of a display device according to the present disclosure.

FIG. 2 is a rear perspective view showing an example of the display device 100 according to the present disclosure. The display device 100 may have the display module 151 mounted on the front surface thereof, and include a main body 130 in which various components such as a printed circuit board and a battery are mounted on the rear surface thereof.

Additionally, the display device 100 may include a back cover 131 that covers a rear surface of the main body 130. The back cover 131 constitutes an outer appearance of the rear surface of the display device 100 and protects the various components mounted in the display device 100. The back cover 131 may have a certain level of rigidity and may include irregularities protruding forward to create a smooth surface in a rearward direction.

The display device according to the present disclosure may include a stand panel 161 coupled to a rear surface of the back cover 131. The stand panel 161, as a plate-shaped member, may be disposed to form the same plane with the back cover 131 in a folded state (a closed state), as shown in (a) in FIG. 2, and may be opened to form a predetermined angle (an open angle) with the back cover 131 in an unfolded state (an open state) as shown in (b) in FIG. 2.

Figure 3:
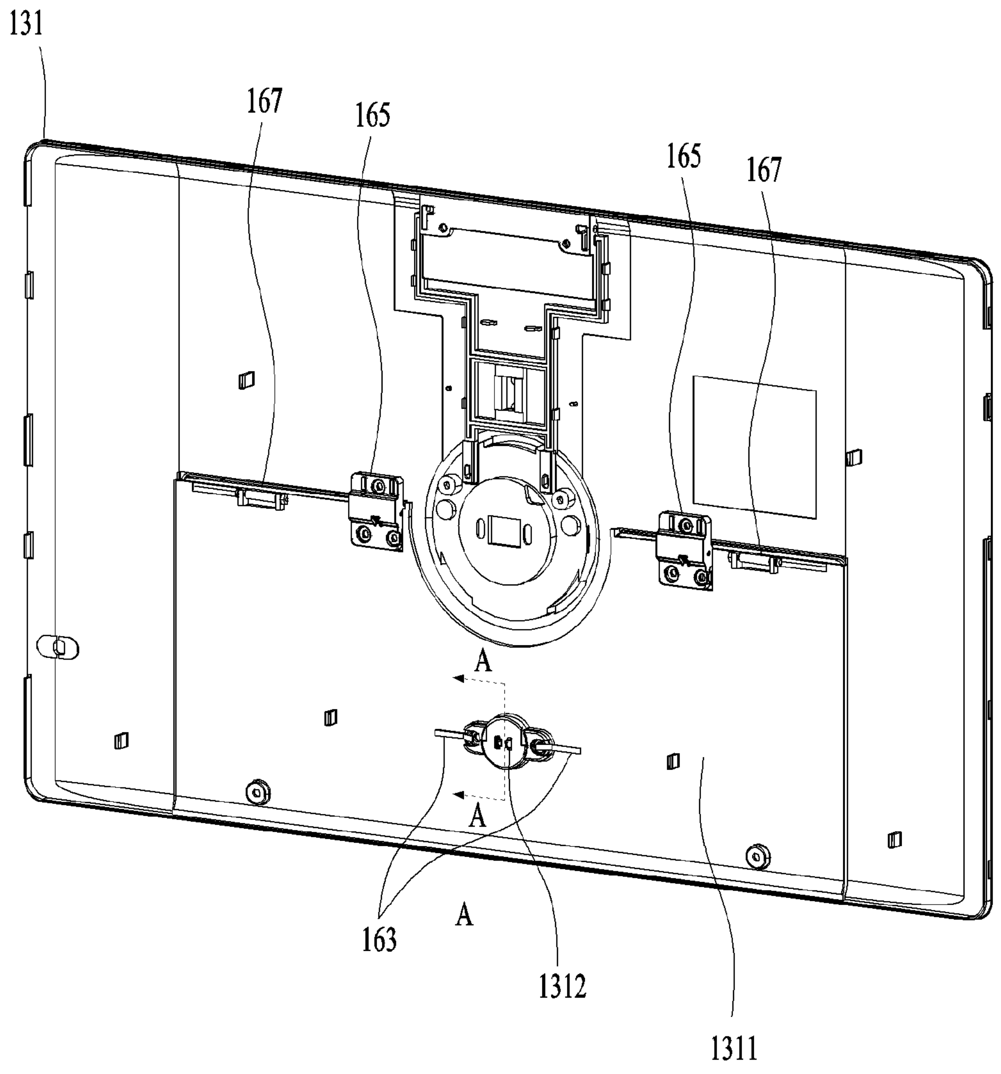
FIG. 3 is a diagram showing a front surface of a back cover according to an example of a display device in the present disclosure.

FIG. 3 is a diagram showing a front surface of the back cover 131 according to an example of the display device 100 in the present disclosure.

The back cover 131 may include a stand seating portion 1311 retracted forward with a thickness corresponding to a thickness of the stand panel 161 and where the stand panel 161 may be seated. The stand panel 161 may include an elastic hinge module 165 that is pivotably coupled to the back cover 131 at an upper end 1616 thereof and couples the stand panel 161 with the back cover 131 at a portion above the stand seating portion 1311.

The stand panel 161 according to the present disclosure has the small thickness, so that the stand panel 161 achieves a rear surface design continuously connected to the back cover 131 in the closed state, thereby achieving an integrated outer appearance. The user may change a location of use by folding the stand panel 161 and easily mount the stand panel 161 by opening the same. Because the stand panel 161 is thin, the stand panel 161 may be constructed to have a predetermined width in a horizontal direction to be stably supported in the open state.

When a vertical size of the stand panel 161 is small, it is difficult to stably support the display device 100, so that the stand panel 161 may be constructed to have the vertical size about half of a vertical size of the display device 100.

The stability of the display device 100 may be ensured only when the stand panel 161 supports the display device 100 at a vertical level higher than a center of gravity of the display device 100.

In addition, unlike the small display device 100, the large display device 100 is viewed from a distance away, so that it is desirable that the large display device 100 does not tilt much with respect to a vertical direction. When the vertical length of the stand panel 161 is great, the display device 100 may be stably supported even when an opening angle of the stand panel 161 is small, so that a tilt angle of the display device 100 mounted using the stand panel 161 may be reduced.

To support the main body 130 of the display device 100, a joint connecting the stand panel 161 with the back cover 131 requires a certain level of rigidity, and a component that may maintain the open state of the stand panel 161 and a component that may maintain the closed state of the stand panel 161 are required.

The display device 100 according to the present disclosure may include a button 162 to maintain the closed state.

Figure 4:
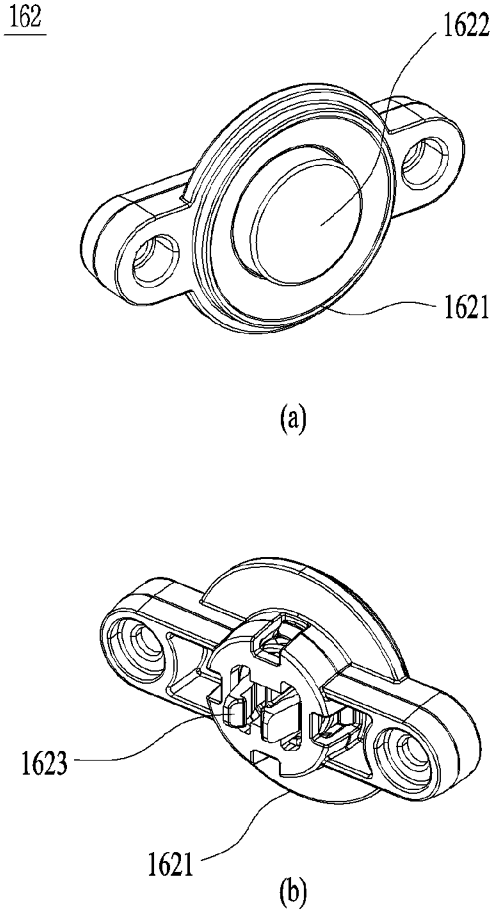
FIG. 4 is a diagram showing a button according to an example of a display device in the present disclosure.
Figure 5:
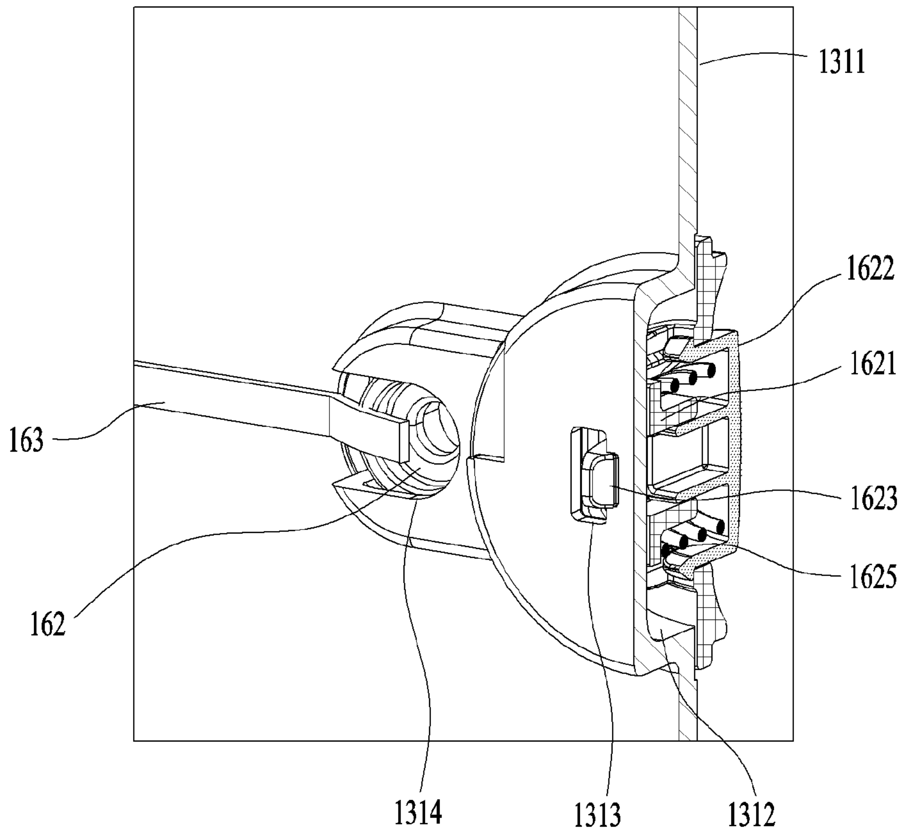
FIG. 5 is a cross-sectional view taken along a line A-A in FIG. 3.

FIG. 4 is a diagram showing the button 162 according to an example of the display device 100 in the present disclosure, and FIG. 5 is a cross-sectional view taken along a line A-A in FIG. 3 showing a state in which the button 162 is coupled to the stand panel 161 and the back cover 131.

(a) in FIG. 4 is a rear view, and (b) is a front view. The button 162 may include a latch 1623 that is coupled to the stand panel 161 and is caught in a latch hole 1313 of the back cover 131 in the closed state.

A button main body 1621 that is fixed to the stand panel 161 and has the latch 1623 located in the front, and a pressable portion 1622 that is coupled to a rear surface of the button main body 1621 and exposed to the rear surface of the stand panel 161 may be included. When the pressable portion 1622 is pressed, the latch 1623 may open in a direction to be separated from the latch hole 1313 of the back cover 131, and the latch 1623 may be separated from the latch hole 1313.

As shown in (b) in FIG. 4, the latch 1623 may include latches arranged in a bilaterally symmetric manner, and protruding hooks of the respective latches 1623 may be arranged to face each other. The pressable portion 1622 may include a release protrusion that moves between the pair of latches 1623 and adjusts a spacing between the latches 1623. When the pressable portion 1622 is pressed, the spacing between the latches 1623 may be increased, and thus, the latches may be separated from the latch hole 1313.

As shown in FIG. 3, the back cover 131 may include a button seating portion 1312 where the button 162 is located. The button 162 may be located slightly below a center in the vertical direction of the stand panel 161.

The location of the button 162 is not necessarily limited. Because the button seating portion 1312 protrudes forward, a location of the button seating portion 1312 may be determined by considering arrangement with the components mounted on the main body 130.

A button spring 1625 located between the pressable portion 1622 and the button main body 1621 may be included such that the pressable portion 1622 is restored to the original location thereof after the latch 1623 is separated from the latch hole 1313 by pressing the pressable portion 1622 forward. As shown in FIG. 5, a coil spring, a leaf spring, or a dome spring may be used as the button spring.

An open elastic portion 163 that applies a force in a direction to separate the stand panel 161 from the back cover 131 when the latch 1623 is separated from the latch hole 1313 may be included. The open elastic portion 163 serves to push the stand panel 161 rearwards when a fixing force of the button 162 is removed.

The open clastic portion 163 may use an elastic spring member, and may use the leaf spring as shown in FIG. 5 in the present embodiment to minimize a mounting space.

The open clastic portion 163 may be located on a rear surface of the stand seating portion 1311 of the back cover 131, but may be located in front of the back cover 131 to prevent the thickness of the display device 100 from increasing.

The open clastic portion 163 may press the stand panel 161 or press the button 162, but the button 162 protrudes forwards as shown in FIG. 5, so that it is easy for the open elastic portion 163 to provide a pushing force rearwards. In the present embodiment, a button hole 1314 may be defined in the button seating portion 1312, and the button 162 may be pressed rearwards via the button hole 1314.

One side of the open elastic portion 163 may be coupled to the inside of the back cover 131 and the other side thereof may be disposed to overlap the button 162 via the button hole 1314. The open elastic portion 163 may be pressed when the button 162 is located in the button seating portion 1312, and provide elasticity to press the button 162 rearwards when the latch 1623 of the button 162 is separated from the latch hole 1313.

The open clastic portion 163 may press the button 162 rearwards when the latch 1623 of the button 162 is released, so that the stand panel 161 may automatically open.

The stand panel 161 pushed by the open elastic portion 163 may be stably fixed only when the open state as shown in (b) in FIG. 2 is maintained. The display device 100 according to the present disclosure may include the elastic hinge module 165 that may stably fix the stand panel 161 in the open state at a predetermined angle with the back cover 131.

Figure 6:
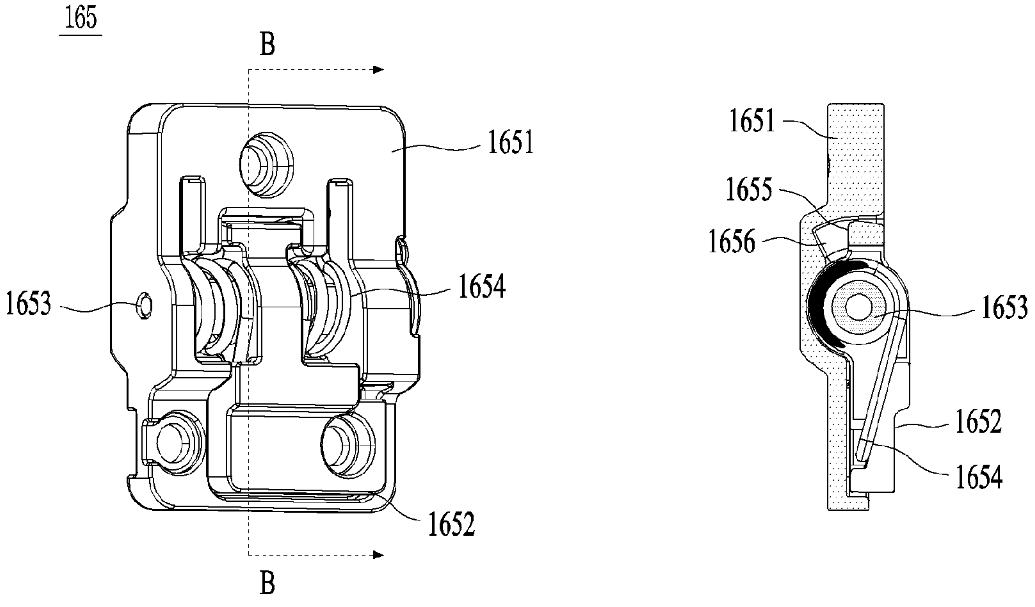
FIG. 6 shows a perspective view and a cross-sectional view showing a hinge module in a closed state of a display device according to the present disclosure.
Figure 7:
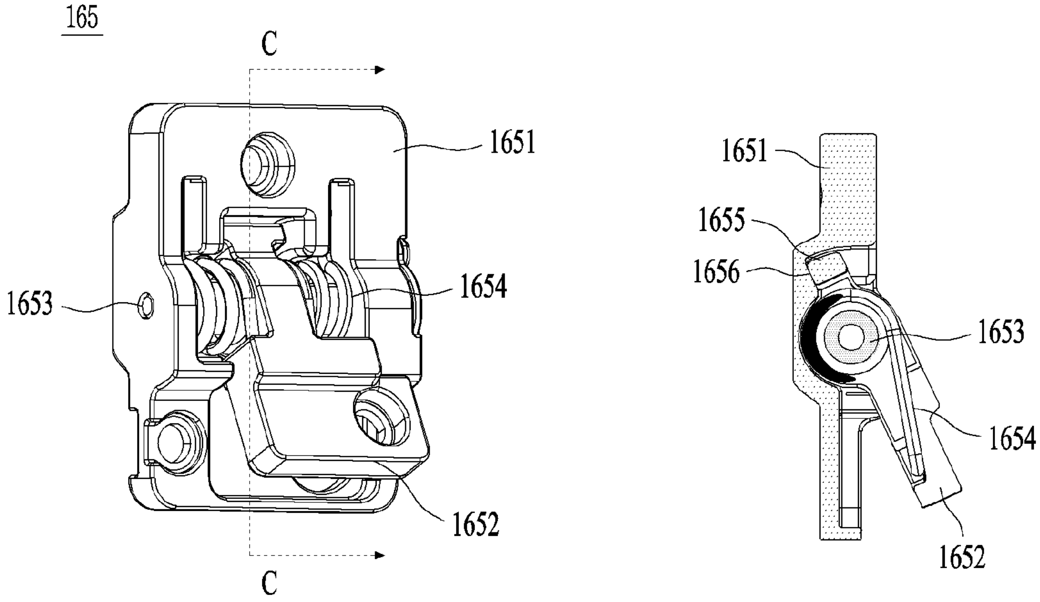
FIG. 7 shows a perspective view and a cross-sectional view showing a hinge module in an open state of a display device according to the present disclosure.

FIG. 6 shows a perspective view and a cross-sectional view showing the hinge module 165 in the closed state of the display device 100 according to the present disclosure, where (a) is a perspective view and (b) is a cross-sectional view taken along a line B-B in (a). FIG. 7 shows a perspective view and a cross-sectional view showing the hinge module 165 in the open state of the display device 100 according to the present disclosure, where (a) is a perspective view and (b) is a cross-sectional view taken along a line C-C in (a).

The hinge module 165 may include a first hinge bracket 1651, a second hinge bracket 1652, and a hinge shaft 1653 that connects the first hinge bracket 1651 with the second hinge bracket 1652. The second hinge bracket 1652 may be pivotable with respect to the first hinge bracket 1651 around the hinge shaft 1653, and the first hinge bracket 1651 may be coupled to the back cover 131 and the second hinge bracket 1652 may be coupled to the stand panel 161.

The first hinge bracket 1651 and the second hinge bracket 1652 may include a hinge spring 1654 that may maintain an open angle state such that an angle between the first hinge bracket 1651 and the second hinge bracket 1652 is maintained in the open state as shown in (b) in FIG. 2.

The hinge spring 1654 may use a torsion spring with a coil that surrounds a circumference of the hinge shaft 1653 and has both ends extending to be respectively coupled to the first hinge bracket 1651 and the second hinge bracket 1652. As both ends of the torsion spring are constructed to have an angle corresponding to the open angle, the clastic hinge module 165 may maintain the state shown in FIG. 6 in the absence of external force.

When the user presses the stand panel 161 forwards to couple the latch 1623 of the button 162 to the latch hole 1313, the stand panel 161 may remain closed, and the hinge spring 1654 of the elastic hinge module 165 may be pressed in the closed state to be in a state as shown in FIG. 7.

When the stand panel 161 is opened by pressing the button 162, the stand panel 161 may be spaced apart from the back cover 131 by the open elastic portion 163 and the hinge module 165 may be fixed in the state shown in FIG. 6 by the elasticity of the hinge spring 1654.

Referring to FIG. 3, the hinge module 165 may be located in front of the back cover 131 and not be exposed to the outside. In particular, the hinge module 165 must be connected to both the back cover 131 and the stand panel 161, and the back cover 131 may include a hinge hole 1315 that is an opening for connecting the second hinge bracket 1652 of the hinge module 165 with the stand panel 161.

Figure 8:
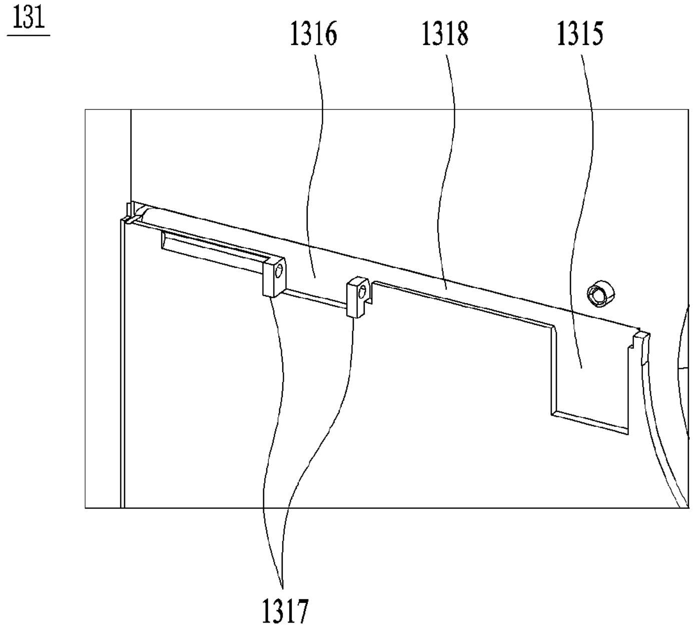
FIG. 8 is a diagram showing a back cover according to an example of a display device of the present disclosure.
Figure 9:
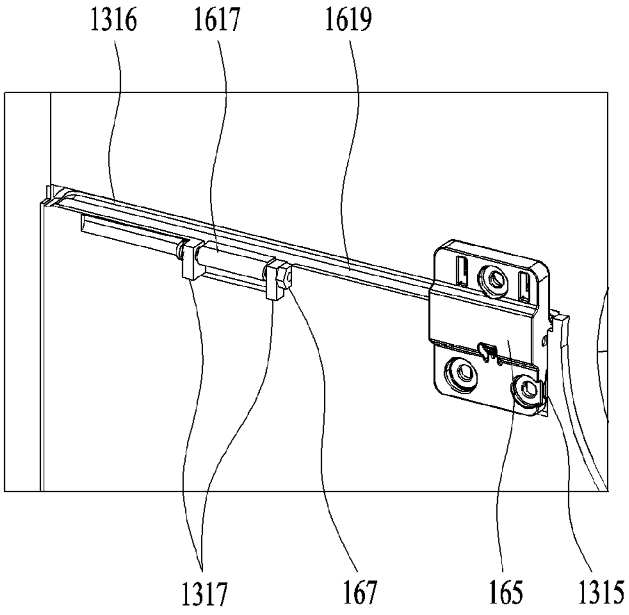
FIG. 9 is a diagram showing a joint of a stand and a back cover according to an example of a display device of the present disclosure.

FIG. 8 is a diagram showing the back cover 131 according to an example of the display device 100 of the present disclosure, and FIG. 9 is a diagram showing the joint of the stand and the back cover 131 according to an example of the display device 100 of the present disclosure. The stand panel 161 and the back cover 131 may be fastened to each other via an opening of the back cover 131 shown in FIG. 8.

The hinge module 165, an auxiliary shaft 167, and the like that connect the back cover 131 with the stand panel 161 may be located in front of the back cover 131 to minimize the number of components exposed rearwards. No irregularities may be formed on the rear surface, and a clean rear surface design may be achieved.

Openings 1315 and 1316 for connecting to the coupling structure may be defined in a portion where the upper end 1616 of the stand panel 161 is located, that is, an upper end of the stand seating portion 1311 of the back cover 131.

The second hinge bracket 1652 may be fastened to an upper portion of the stand panel 161 via the hinge hole 1315 defined at a location corresponding to the second hinge bracket 1652 of the hinge module 165. The first hinge bracket 1651 located above the hinge hole 1315 may be fastened to the front surface of the back cover 131.

As shown in FIG. 3, the hinge module 165 may include a pair of hinge modules 165 located at left and right sides. It is good to have a greater number of hinge modules 165, but a volume of the hinge module 165 is great and a cost increases. The auxiliary shaft 167 directed in the same axial direction as the hinge shaft 1653 of the hinge module 165 may be further included.

The hinge module 165 provides a force to maintain the angle in the open state via the hinge spring 1654, but the auxiliary shaft 167 pivotably connects the stand panel 161 with the back cover 131 to assist in maintaining the stable coupling of the back cover 131 and the stand panel 161.

The auxiliary shaft 167 may also be located inwardly of the back cover 131 so as not to be exposed to the outside, and the auxiliary shaft 167 may extend through a first shaft joint 1617 of the stand panel 161 and a second shaft joint 1317 of the back cover 131.

As shown in FIG. 9, the first shaft joint 1617 may protrude forwardly of the back cover 131 via the shaft hole 1316 defined in the back cover 131 and may be disposed adjacent to the second shaft joint 1317 in the horizontal direction.

The back cover 131 may further include a stand opening 1318 located on the shaft hole 1316 and the hinge hole 1315. The stand opening 1318, as an opening defined at a location corresponding to the upper end 1616 of the stand panel 161, may extend in an elongate manner in the horizontal direction. That is, the stand opening 1318 is an upper end of the stand seating portion 1311. When the angle of the stand panel 161 changes, the stand upper end 1616 may protrude slightly forward in the open state rather than in the closed state.

To provide a space for the upper end 1616 of the stand panel 161 to move, the back cover 131 may include the stand opening 1318 extending in the elongate manner in the horizontal direction at the location corresponding to the upper end of the stand panel 161.

However, the stand opening 1318 weakens the rigidity of the back cover 131, and when the stand panel 161 supports the display device 100, the force is transmitted via the upper end 1616 of the stand panel 161 and the force is concentrated at the upper end of the stand panel 161.

Figure 10:
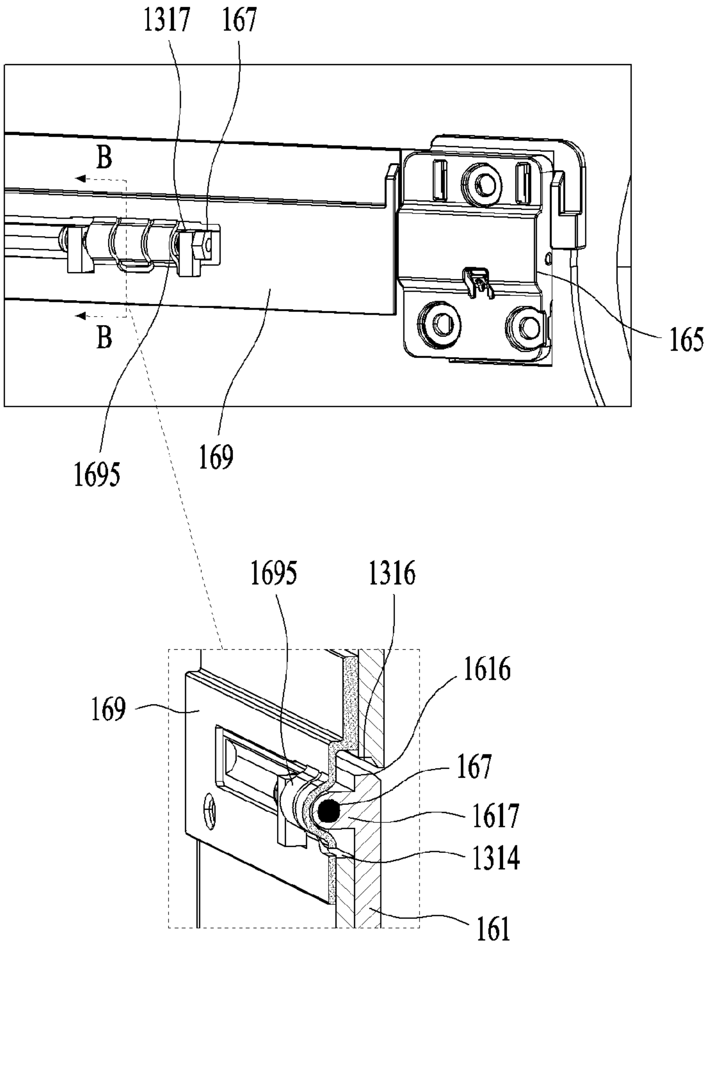
FIG. 10 is a diagram showing a coupled state of a reinforcing bracket according to an example of a display device of the present disclosure.

FIG. 10 is a diagram showing a coupled state of a reinforcing bracket 169 according to an example of the display device 100 of the present disclosure. Because the back cover 131 may be damaged at a location corresponding to the stand opening 1318, the reinforcing bracket 169 may be further included to protect the back cover.

The reinforcing bracket 169 may cover the stand opening 1318 on the front surface of the back cover 131, and may further include a shaft cover 1695 that surrounds the first shaft joint 1617 of the stand panel 161 to which the auxiliary shaft 167 is fastened.

The display device according to at least one embodiment of the present disclosure may be easily mounted anywhere via the stand panel 161 disposed to be foldable on the rear surface thereof without a need to additionally combine a separate stand.

In addition, the display device 100 that secures rigidity of the joint of the stand panel 161 to support a load of the large device and to be stably mounted may be provided.

In addition, the opening operation of the stand panel 161 is made semi-automatically, so that the stand panel 161 is opened and closed stably.

The above detailed description should not be construed as restrictive in any respect and should be considered illustrative. The scope of the present disclosure must be determined by reasonable interpretation of the attached claims, and all changes within the equivalent scope of the present disclosure are included in the scope of the present disclosure.

What is claimed is:

1. A display device comprising:

a main body comprising a display at a front thereof;

a back cover covering a rear of the main body;

a stand panel coupled to the back cover via an elastic hinge module;

wherein the elastic hinge module is mounted on a front surface of the back cover and extends through a hinge hole defined in the back cover to adjust an angle of the stand panel with respect to the back cover; and a button fastened to the stand panel and configured to operate a latch which engages with the back cover to secure the stand panel to the back cover, wherein the button is located at a center of the stand panel with respect to a horizontal direction, wherein the elastic hinge module is one of a plurality of elastic hinge modules spaced apart from each other with respect to the horizontal direction.

2. The display device of claim 1, wherein the button comprises:

a button main body fixed to the stand panel and comprising the latch protruding in a forward direction;

a pressable portion configured to separate the latch of the button main body from the back cover when pressed; and a button spring located between the button main body and the pressable portion.

3. The display device of claim 1, further comprising an open elastic portion coupled to the back cover and configured to provide a force pushing the stand panel in a rearward direction.

4. The display device of claim 3, wherein the open elastic portion is located on the front surface of the back cover, wherein the back cover includes:

a button seating portion shaped to accommodate the button;

a latch receiving hole defined in the button seating portion; and a button hole defined in the button seating portion, wherein the open elastic portion contacts with an exposed portion of the button through the button hole.

5. The display device of claim 1, wherein the elastic hinge module includes:

a first hinge bracket mounted to the back cover;

a second hinge bracket mounted to the stand panel via the hinge hole;

a hinge shaft connecting the first hinge bracket and the second hinge bracket to each other; and a hinge spring configured to provide a force toward an open angle between the first hinge bracket and the second hinge bracket.

6. The display device of claim 5, further comprising:

a shaft hole defined at the back cover and spaced apart from the hinge hole in a horizontal direction;

a first shaft joint located at an upper end of the stand panel and extending forward through the shaft hole;

a second shaft joint located at the back cover laterally adjacent to the hinge hole; and an auxiliary shaft extending through the first shaft joint and the second shaft joint.

7. The display device of claim 6, further comprising:

a stand opening connected to the shaft hole and the hinge hole and disposed to correspond to the upper end of the stand panel.

8. The display device of claim 7, further comprising:

a reinforcing bracket coupled to the front surface of the back cover and covering the stand opening.

9. The display device of claim 8, wherein the reinforcing bracket includes a shaft reinforcing portion surrounding the first shaft joint.

10. The display device of claim 1, wherein the back cover includes a stand seating portion recessed at a rear of the back cover corresponding to the stand panel, wherein a depth of the stand seating portion corresponds to a thickness of the stand panel.

11. A display device comprising:

a main body comprising a display at a front thereof;

a back cover covering a rear of the main body;

a stand panel coupled to the back cover via a hinge module;

wherein the hinge module is mounted on a front surface of the back cover and extends through a hinge hole defined in the back cover to adjust an angle of the stand panel with respect to the back cover; and a button fastened to the stand panel and configured to operate a latch which engages with the back cover to secure the stand panel to the back cover wherein the hinge module includes:

a first hinge bracket mounted to the back cover;

a second hinge bracket mounted to the stand panel via the hinge hole;

a hinge shaft connecting the first hinge bracket and the second hinge bracket to each other; and a hinge spring configured to provide a force toward an open angle between the first hinge bracket and the second hinge bracket.

12. The display device of claim 11, further comprising:

a shaft hole defined at the back cover and spaced apart from the hinge hole in a horizontal direction;

a first shaft joint located at an upper end of the stand panel and extending forward through the shaft hole;

a second shaft joint located at the back cover laterally adjacent to the hinge hole; and an auxiliary shaft extending through the first shaft joint and the second shaft joint.

13. The display device of claim 12, further comprising:

a stand opening connected to the shaft hole and the hinge hole and disposed to correspond to the upper end of the stand panel.

14. The display device of claim 13, further comprising:

a reinforcing bracket coupled to the front surface of the back cover and covering the stand opening.

15. The display device of claim 14, wherein the reinforcing bracket includes a shaft reinforcing portion surrounding the first shaft joint.

* * * * *